United States Patent [19]
Ravanelli et al.

[11] Patent Number: 5,496,761
[45] Date of Patent: Mar. 5, 1996

[54] METHOD OF MAKING JUNCTION-ISOLATED HIGH VOLTAGE MOS INTEGRATED DEVICE

[75] Inventors: Enrico M. A. Ravanelli, Monza; Flavio Villa, Milan, both of Italy

[73] Assignee: SGS-Thomson Microelectronics S.r.l., Agrate Brianza, Italy

[21] Appl. No.: 456,660

[22] Filed: Jun. 2, 1995

Related U.S. Application Data

[62] Division of Ser. No. 47,965, Apr. 15, 1993, Pat. No. 5,434,445.

[30] Foreign Application Priority Data

Apr. 17, 1992 [EP] European Pat. Off. ............. 92830190

[51] Int. Cl.⁶ ............................................. H01L 21/761
[52] U.S. Cl. ............................ 437/60; 437/50; 437/919
[58] Field of Search ................................ 437/47, 48, 50, 437/60, 919; 148/DIG. 14

[56] References Cited

U.S. PATENT DOCUMENTS

| | | | |
|---|---|---|---|
| 4,358,890 | 11/1982 | Heller et al. | 437/50 |
| 4,419,812 | 12/1983 | Topich | 437/919 |
| 4,790,630 | 12/1988 | Maurice | 437/60 |
| 5,053,352 | 10/1991 | Kaiser | 437/60 |

FOREIGN PATENT DOCUMENTS

| | | |
|---|---|---|
| 0461877 | 12/1991 | European Pat. Off. . |
| 2077493 | 12/1981 | United Kingdom . |

*Primary Examiner*—Chandra Chaudhari
*Attorney, Agent, or Firm*—David M. Driscoll; James H. Morris

[57] ABSTRACT

An integrated device includes isolating regions of a first type of conductivity, each surrounding an epitaxial pocket of an opposite type of conductivity, and housing drain and source regions, and covered with an oxide layer housing gate regions and over which extend the source, drain and gate connections. For linearizing potential distribution at the epitaxial pocket—isolating region junction and close to the source regions beneath the connections, these regions are provided with a double chain of condensers embedded in the oxide layer and the terminal elements and the intermediate element of which are biased to predetermined potentials.

2 Claims, 3 Drawing Sheets

METHOD OF MAKING JUNCTION-ISOLATED HIGH VOLTAGE MOS INTEGRATED DEVICE

This application is a division of application Ser. No. 08/047,965, filed Apr. 15, 1993, entitled JUNCTION-ISOLATED HIGH-VOLTAGE MOS INTEGRATED DEVICE, and now U.S. Pat. No. 5,434,445.

BACKGROUND OF THE INVENTION

1. Field of the Invention

The present invention relates to a junction-isolated MOS integrated device.

2. Discussion of the Related Art

In integrated circuits of the above type, particularly those comprising LDMOS (Lateral Diffused Metal Oxide Semiconductor) transistors, each epitaxial pocket houses a respective device for isolating it electrically from adjacent devices and is surrounded by an isolating region extending from the surface of the integrated circuit to the substrate. The isolating region presents an opposite type of conductivity as that of the epitaxial pocket, and is so biased as to form, with the epitaxial pocket, a reverse-biased junction.

In circuits of this type, the gate, source and drain connections must be able to pass from the epitaxial pocket, over the isolating regions, without producing premature breakdown of the epitaxial pocket-isolating region junction, particularly in the two below-listed circuit configurations: "source-grounded", wherein the source region is grounded, the gate region presents a potential of a few volts, and the drain region presents a high potential relative to ground; and "source-follower", wherein the source, gate and drain regions present high potentials relative to ground (substrate).

Current technology provides for a maximum breakdown voltage approximately within the range 250–300 V, which thus represents the maximum voltage that can be used on the circuit.

It is an object of the present invention to provide an integrated device of the aforementioned type designed to ensure a higher breakdown voltage than currently available, and preferably of over 650 V.

SUMMARY OF THE INVENTION

According to the present invention, there is provided a junction-isolated MOS integrated device including a double capacitor chain.

A preferred embodiment of the present invention features a double capacitor chain including electrically conductive regions embedded in an insulating layer and superimposed on epitaxial pocket-isolating region junctions. The terminal elements and the intermediate element of the double chain are so biased as to ensure uniform distribution of potential in the protected region and so as to prevent premature breakdown.

Capacitor chains consisting of electrically conductive regions have already been proposed (e.g. British Patent GB-A-2.077.493 filed by Sharp K. K.)These known structures, however, are applied to self-insulated NMOS-PMOS processes in which no distinction is made between the drift regions and the substrate of the circuit. In the junction-isolated processes of the present invention, on the other hand, each device is integrated in its own epitaxial pocket, and isolated externally or from any adjacent devices by diffusion.

Moreover, known capacitor chains form part of the high-voltage device, and in no way provide for protecting the underlying layers.

Finally, the intermediate elements of known capacitor chains are entirely floating, so that linear potential distribution is only achievable between the terminal elements. Consequently, known chains operate either exclusively upwardly or downwardly, and fail to provide for potential distribution as required.

BRIEF DESCRIPTION OF THE FIGURES

A preferred, non-limiting embodiment of the present invention will be described with reference to the accompanying drawings, in which.

DETAILED DESCRIPTION

Figure 1A:
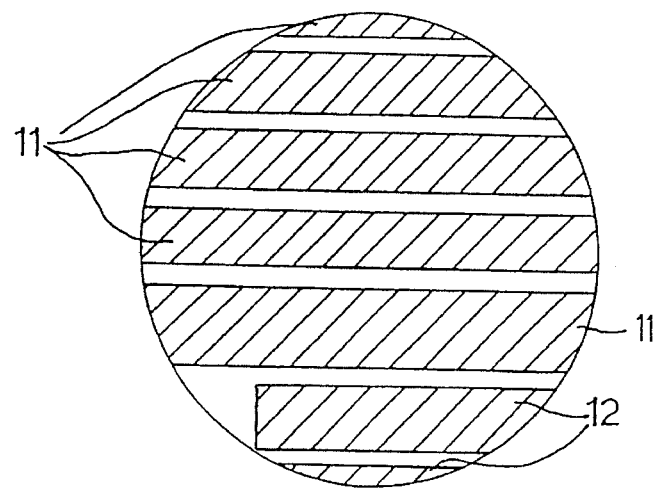
FIG. 1 shows a simplified top plan view of part of a device in accordance with the present invention.
Figure 1:
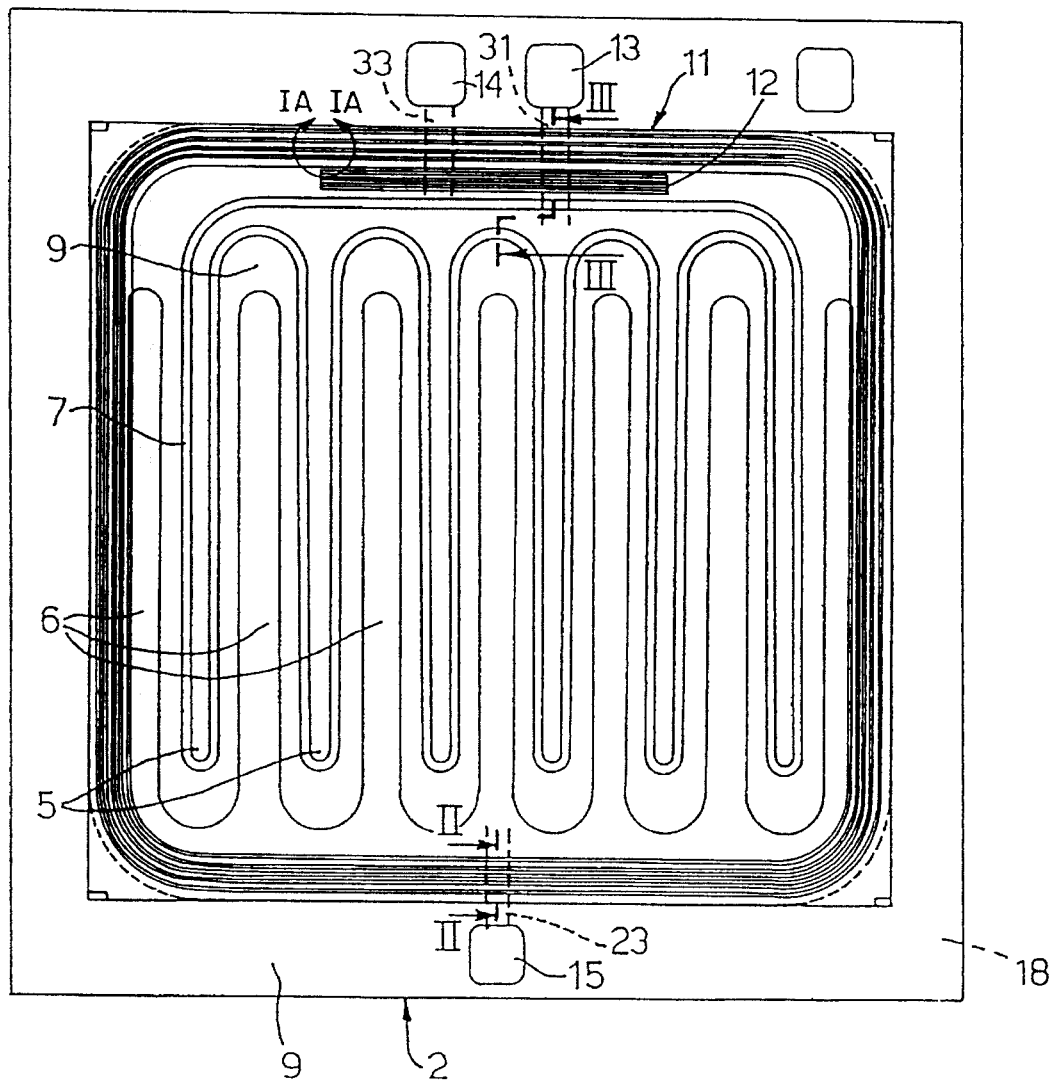
Figure 2:
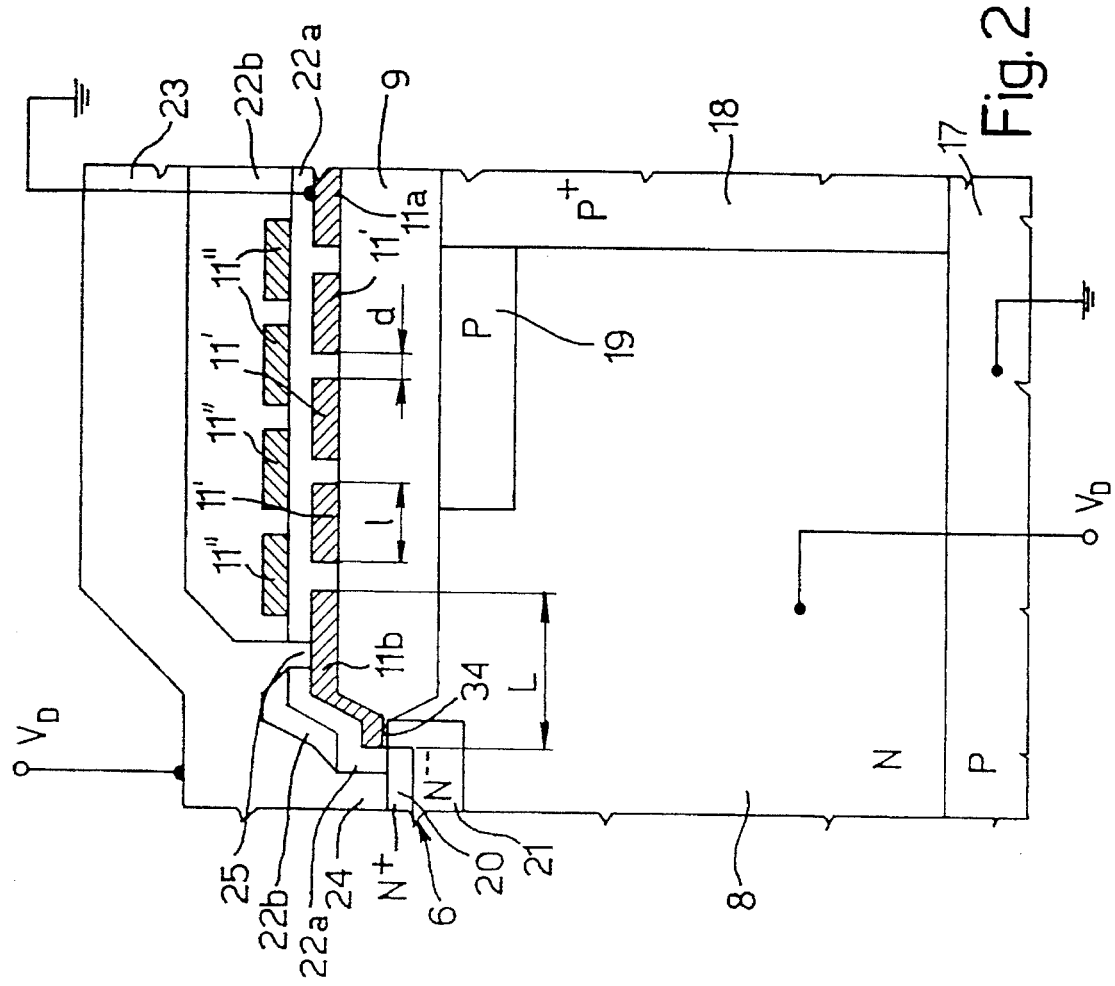
FIG. 2 shows a partial cross section of the device taken along line II—II of FIG. 1.
Figure 3:
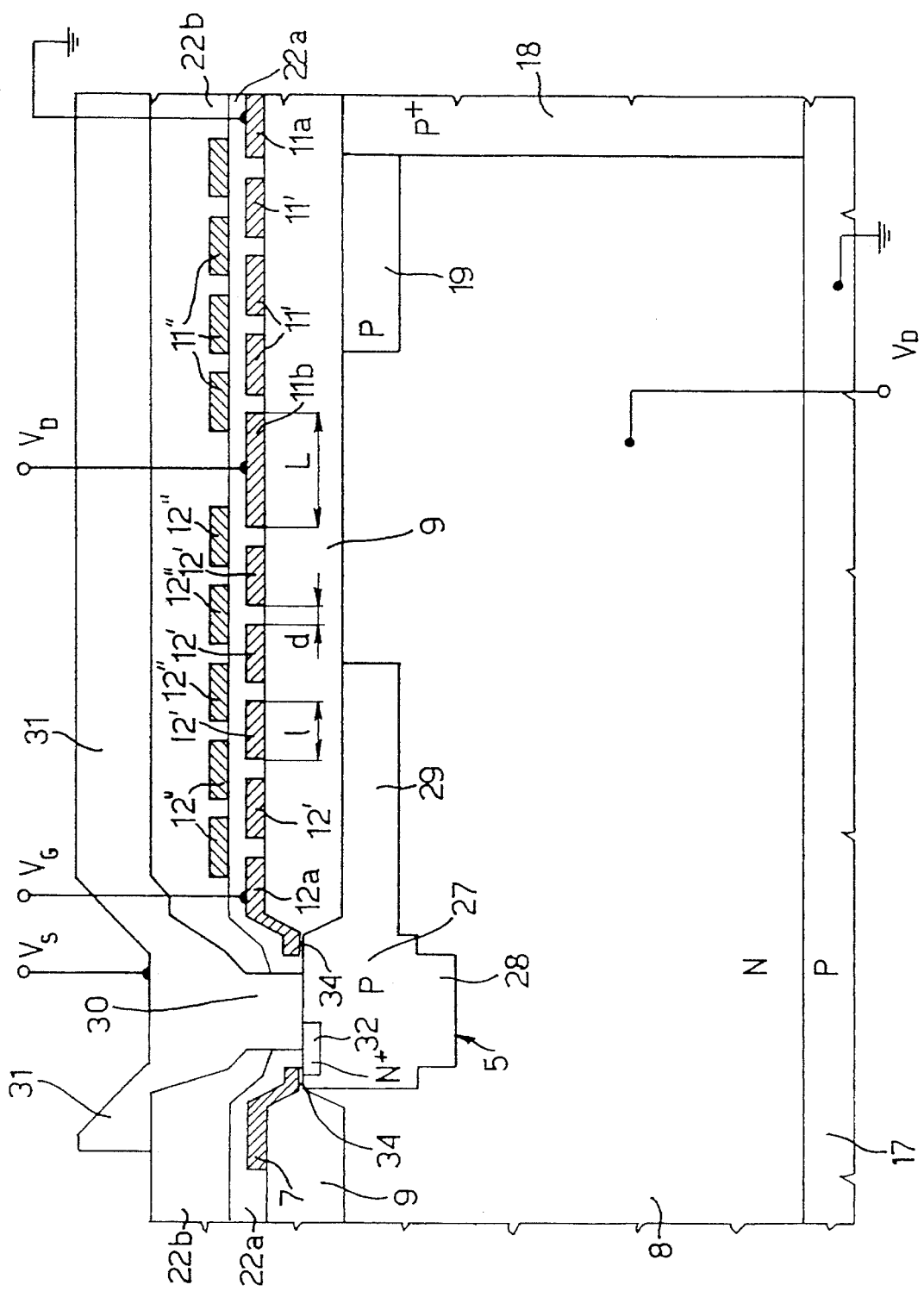
FIG. 3 shows a partial cross section of the device taken along line III—III of FIG. 1.

FIG. 1 shows a junction-isolated LDMOS integrated device 2 housed in an epitaxial pocket and junction-isolated externally in a conventional manner by means of an isolating region 18 (shown clearly in FIGS. 2 and 3).

As shown in FIG. 1, which, for the sake of simplicity, shows the top capacitors (as explained in detail below with reference to FIGS. 2 and 3), and only a partial view of the connecting layers, device 2 presents a source region 5 consisting of a number of "fingers"; a drain region 6 consisting of a number of fingers alternating with those of source region 5; a gate region 7 extending in a loop about source region 5; and a thick layer of oxide 9 surrounding regions 5–7 and extending between the fingers of source and drain regions 5 and 6, respectively.

Inside isolating region 18, polycrystalline silicon elements 11, 12 extend over oxide layer 9, with the exception of one portion (as shown in FIGS. 2 and 3). More specifically, elements 11 and 12 extend over the epitaxial pocket-isolating region junction, and comprise a number of rings 11 extending at two different levels; and straight portions 12 also extending at two different levels coincident with those of rings 11. In particular, straight portions 12 are provided close to the source and gate contactpads 13 and 14, respectively. FIG. 1 also shows the drain contact pad 15, and (in dotted lines) the portions of the drain, gate and source connections 23, 33, 31 over elements 11, 12.

The design and arrangement of elements 11, 12 are shown more clearly in FIGS. 2 and 3 to which the following description refers.

FIG. 2, which shows a cross-section of device 2 at the point in which the metal drain connection crosses over the epitaxial pocket-isolating region junction, shows a P-type substrate 17 over which extends an N-type epitaxial pocket 8. To the right of epitaxial pocket 8, part of $P^+$-type isolating region 18 extends from substrate 17 to oxide layer 9. To the side of isolating region 18, a P-type-conductivity protection ring 19 extends beneath oxide layer 9 in the direction of drain region 6, which, as shown in FIG. 2, comprises an $N^+$-type layer 20 extending inside epitaxial pocket 8 and surrounded towards oxide layer 9 by an N⁻⁻-type-conductivity region 21 doped less heavily than region 20.

FIG. 2 also shows polycrystalline silicon (polysilicon) protection rings 11. A first series of rings, referred to hereinafter as bottom rings 11', 11a, extends over and directly contacting oxide layer 9; while a ring 11b extends over the "beak" of oxide layer 9, and therefore presents a top horizontal portion on a level with rings 11', an inclined portion, and a bottom horizontal portion over region 21 and insulated from it by a thin oxide layer 34. Rings 11', 11a and 11b are all made from the same material as the gate region, at the same stage, and using the same mask.

A second series of rings 11" extends over the first series 11', 11a, 11b, from which it is insulated electrically by a thermally grown layer of silicon oxide 22a covering the entire surface of device 2 and in which rings 11' are embedded. As can be seen, rings 11" are offset in relation to rings 11', 11a, 11b, so that each top ring 11" is located over the gap between two bottom rings 11', 11a, 11b. Top rings 11" are made of high-resistivity polysilicon of a greater resistivity than rings 11', 11a, 11b.

Rings 11' and 11" present the same width l, and the rings on both levels are separated by the same distance d. Ring 11b, on the other hand, presents a width L>l, and each ring 11" overlaps the two underlying rings 11', 11a, 11b by a portion equal to (l–d)/2.

Over thermally grown oxide layer 22a, there extends a deposited oxide layer 22b and, over this, a metal layer 23 constituting the connection between the drain region and pad 15 (FIG. 1). As shown, layer 23, connected to drain potential $V_D$, is connected electrically by contact 24 to drain region 6, and also at 25 to ring 11b, which is thereby set to the same voltage; the outermost ring 11a over insulating region 18 is connected to substrate 17 defining the ground; and epitaxial pocket 8 is connected to drain potential $V_D$.

FIG. 3 shows a cross section of the portion of device 2 opposite that of FIG. 2 and in which extend the source and gate connections. In addition to substrate 17, epitaxial pocket 8, isolating region 18 with ring 19, thick oxide layer 9, oxide layers 22a, 222b, and rings 11, FIG. 3 also shows straight portions 12, source connection 31, and part of source and gate regions 5 and 7, respectively. More specifically, in this region, thick oxide layer 9 extends further inwardly of the device (to the left in FIG. 3) as compared with that of FIG. 2, so that ring 11b, which in FIG. 2 is located over the beak of thick oxide layer 9, in this case forms a flat strip.

To the left of the innermost ring 11b, straight portions 12 extend at two levels, as in the case of rings 11, and include bottom portions 12' directly contacting oxide layer 9, and top portions 12" located over portions 12' from which they are insulated by thermal oxide layer 22a, and over and between which extends deposited oxide layer 22b. As in the case of rings 11", top portions 12" are offset in relation to bottom portions 12', so that each top portion 12" is located over the gap between adjacent portions 12', 12a, 11b.

Portions 12', 12" all present the same width l as rings 11', 11", and are separated by the same distance d as rings 11. Top portions 12" overlap underlying portions 12', 12a, 11b by an amount equal to (l–d)/2. The innermost straight portion 12a is located over the beak of oxide layer 9, so that, as in the case of ring 11b in FIG. 2, it presents a first horizontal portion contacting oxide layer 9, an inclined portion corresponding with the beak of oxide layer 9, and a second horizontal portion over a thin oxide portion 34 at source finger 5.

The portion of P-type source finger 5 facing isolating region 18 includes a body 27; a sinker 28; and a ring 29 extending beneath oxide layer 9 towards protection ring 19. The portion of source finger 5 housing N⁺-type layer 32 defining the actual source region is connected by contact 30 to metal source connection 31 which is connected to potential $V_S$ to substrate 17 (integrated circuit ground) and extends over the ring 11 and portion 12 as far as contact pad 13 (FIG. 1). As shown in FIG. 2, the innermost ring 11b is connected to drain potential $V_D$, and the outermost ring 11a is grounded.

Bottom straight portions 12', 12a are formed together with bottom rings 11', 11a, 11b when forming the gate region. In fact, the innermost straight portion 12a is defined by the gate region itself, as shown in FIG. 1. Top straight portions 12" are formed simultaneously with and using the same high-resistivity polycrystalline material as top rings 11".

Rings 11, defining a first chain of roughly series capacitors, provide for linearizing potential distribution in the isolating region 18-epitaxial pocket 8 junction region, where protection ring 19, by emptying gradually, also provides for maintaining linear distribution close to insulating region 18, and so preventing premature breakdown of the device caused by an overly high electric field produced by the connections passing over insulating region 18.

The minimum number of rings 11', 11", 11a, 11b depends in general on the maximum breakdown voltage of the silicon oxide of which layer 22 is made. Width l and spacing d of the rings affects potential distribution linearity between the polysilicon rings, while the length and surface concentration of protection ring 19 about isolating region 18 determine the maximum breakdown voltage of the device. By appropriately sizing the components, the protection shown is capable of preventing a breakdown of the epitaxial pocket-isolating region junction even in the event of a drain-ground voltage drop of over 650 V ($V_D$>650 V).

Portions 12, in turn, defining a second chain of roughly series capacitors, provide for linearizing potential distribution of device 2 between source fingers 5 and epitaxial pocket 8. In this case also, potential distribution linearity is determined by the width, spacing and number of portions 12, which are in turn determined by the maximum breakdown voltage of the thermal oxide layer.

In FIG. 3, which presents a double chain of both rings 11 and portions 12, the innermost ring 11b constitutes an intermediate element common to and ensuring the continuity of both chains. By virtue of the linear potential distribution provided for by the two half-chains (close to isolating region 18 and source fingers 5 respectively) and the possibility of appropriately biasing intermediate element 11b and terminal elements 11a, 12a, the chain as a whole is capable of functioning both upwardly and downwardly.

In the case of a source-follower device, wherein the source 5, gate 7 and drain 6 regions and the epitaxial pocket 8 present a high voltage, no appreciable voltage drop exists in the capacitor chain including straight portions 12, which is thus inactive. The capacitor chain consisting of rings 11, on the other hand, is active, and, by ensuring a breakdown voltage of over 650 V, provides for protecting the epitaxial pocket 8-isolating region 18 junction at the crossover point of drain connection 23 (FIG. 2), source connection 31 (FIG. 3) and gate connection 33 (FIG. 1), thus protecting the source-follower device.

In the case of a source-grounded device, wherein the source region is grounded, the gate region presents a low voltage, the drain region and epitaxial pocket present high voltages, and the isolating region is grounded, both the chains are active. In fact, between the innermost ring 11b (intermediate element in the double chain) and the outermost ring 11a, a high voltage drop exists, so that chain 11 operates as described above. Moreover, between the innermost ring 11b and innermost straight portion 12a, a further high voltage drop exists, distribution of which is linearized by the capacitor chain consisting of portions 12, thus linearizing potential distribution between isolating region 18 and source region 5. Source ring 29 contributes towards increasing the breakdown voltage of the structure, which, alternatively, may also be achieved by increasing the number of portions 12. Capacitor chain 12 thus provides for protection in the direction of the source region, and the double chain 11, 12 as a whole for also protecting the device when source-grounded.

Figure 5:
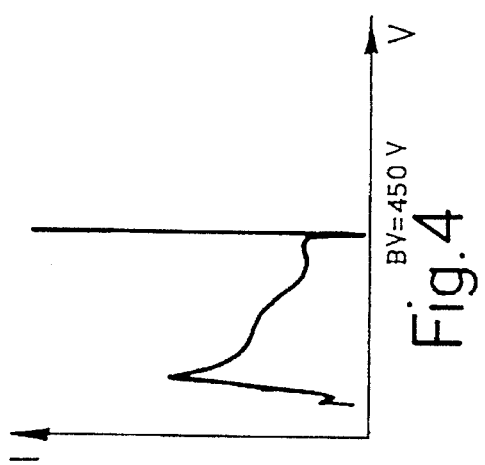
FIGS. 4 and 5 show current-voltage graphs relative to devices featuring a single and double capacitor chain respectively.
Figure 4:
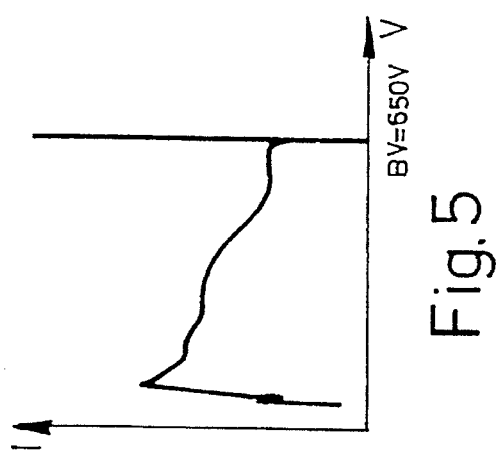

The FIG. 4 and 5 graphs show the results obtainable using the FIGS. 1–3 device. FIG. 4 shows the behavior of the leakage current as a function of the applied voltage of a source-grounded device featuring a single capacitor chain at the crossover point of the source and gate connections (i.e. the ring 11 chain, without the straight portion 12 chain). In this case, breakdown of the device occurs at BV=450 V; the point of failure, on examination, being located at the source end of chain 11 (i.e. at innermost ring 11b).

FIG. 5 shows the behavior of the leakage current as a function of the applied voltage of a source-grounded device featuring a double capacitor chain as shown in FIGS. 1–3. In this case, the breakdown voltage rises to over 650 V; the point of failure, on examination, being located, not at the crossover point of the source, gate and drain connections, but at the source body-epitaxial pocket junction at the end of source fingers 5 (FIG. 1). This type of breakdown is inherent in the device and in no way connected with the capacitor chain, which is thus capable of withstanding even higher voltages.

To those skilled in the art it will be clear that changes may be made to the solution described and illustrated herein without, however, departing from the scope of the present invention. In particular, though the complete solution features a double capacitor chain, in cases not requiring high voltages or not involving high potential drops between different regions, a single chain may be employed. Moreover, in certain cases, rings 11 may be replaced by open as opposed to looped strips, and the design and length of straight portions 12 may be other than as described. Finally, the same solution may also be applied to circuits integrating a number of junction-isolated power devices. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A method of producing a junction-isolated integrated device comprising the steps of:

providing at least one epitaxial pocket of a first conductivity type;

defining source and drain regions within the at least one epitaxial pocket;

substantially surrounding the at least one epitaxial pocket with at least one isolating region of a second conductivity type;

substantially covering the at least one epitaxial pocket with at least one layer of electrically insulating material;

providing at least one electrically conductive connection on the at least one layer of electrically insulating material;

embedding a first chain of capacitors in the at least one layer of electrically insulating material; and biasing first terminal elements, coupled to the first chain of capacitors, to predetermined voltage potentials.

2. A method as claimed in claim 1 further comprising the steps of:

embedding a second chain of capacitors in the at least one layer of electrically insulating material; and biasing second terminal elements, coupled to the second chain of capacitors, to predetermined voltage potentials.

* * * * *